(12) United States Patent
Okubo

(10) Patent No.: US 6,305,825 B1
(45) Date of Patent: Oct. 23, 2001

(54) VEHICLE LIGHTING DEVICE WITH A PLURALITY OF LIGHT-EMITTING DIODES EMPLOYED AS LIGHT SOURCE

(75) Inventor: Katsuhiko Okubo, Komae (JP)

(73) Assignee: Ichikoh Industries, Ltd., Tokyo (JP)

( * ) Notice: Subject to any disclaimer, the term of this patent is extended or adjusted under 35 U.S.C. 154(b) by 0 days.

(21) Appl. No.: 09/577,044

(22) Filed: May 24, 2000

(30) Foreign Application Priority Data

May 26, 1999 (JP) .................................................. 11-146766

(51) Int. Cl.$^7$ ...................................................... F21V 29/00
(52) U.S. Cl. .......................... 362/294; 362/373; 362/547; 362/545
(58) Field of Search ...................................... 362/545, 543, 362/800, 547, 373, 294; 257/99, 88; 313/500

(56) References Cited

U.S. PATENT DOCUMENTS

| | | | |
|---|---|---|---|
| 4,733,335 | * 3/1988 | Serizawa | 362/503 |
| 4,951,179 | 8/1990 | Machida | 362/522 |
| 5,528,474 | 6/1996 | Roney et al. | 362/545 |
| 5,700,080 | * 12/1997 | Okuda | 362/496 |
| 5,785,418 | * 7/1998 | Hochstein | 362/373 |
| 5,857,767 | * 1/1999 | Hochstein | 362/294 |
| 6,099,148 | 8/2000 | Northrup | 362/336 |

* cited by examiner

*Primary Examiner*—Alan Cariaso
*Assistant Examiner*—Hargobind S. Sawhney
(74) *Attorney, Agent, or Firm*—Foley & Lardner

(57) ABSTRACT

There is provided a vehicle lighting device employing a plurality of light-emitting diodes as light sources. Mount pads are provided on a light-emitting diode mount surface of a circuit board. On the circuit board, the mount pads are provided on both sides of a plurality of pairs of through-holes. When two leads of the light-emitting diode are inserted into the pair of two through-holes, respectively, and the light-emitting diode is mounted to the mount pads on the both sides, an air vent space is formed which is defined by the light-emitting diode, the circuit board, and the mount pads on the both sides. Accordingly, air comes out smoothly of the through-holes via the space when solder is entered the through-holes in an automated soldering process. This allows the light-emitting diodes to be disposed in place relative to the circuit board. Furthermore, it is ensured that the leads of the light-emitting diodes and conductive traces of the circuit board are connected to each other via solder.

7 Claims, 4 Drawing Sheets

VEHICLE LIGHTING DEVICE WITH A PLURALITY OF LIGHT-EMITTING DIODES EMPLOYED AS LIGHT SOURCE

BACKGROUND OF THE INVENTION a) Field of the Invention

The present invention relates to a vehicle lighting device which employs a plurality of light-emitting diodes as light sources.

Vehicle lighting devices of this type are used, for example, in tail stop lamps of rear combination lamps or high mount stop lamps.

b) Description of the Prior Art

For example, vehicle lightning devices of this type include those described in U.S. Pat. No. 4,951,179 and U.S. Pat. No. 5,528,474.

The former discloses a vehicle lighting device comprising a plurality of light-emitting diodes (19) arranged in an array on one or a plurality of printed circuit boards (18). The latter discloses a vehicle lighting device comprising a plurality of light-emitting diodes (12) arranged in a matrix on one circuit board (20).

What are critical to vehicle lighting devices of this type are as follows. The items of importance are that the light-emitting diodes should be arranged in place relative to the circuit board, and that the leads of the light-emitting diodes and the conductive traces of the circuit board are reliably connected to each other via solder.

SUMMARY OF THE INVENTION

The present invention relates to a vehicle lighting device configured as set forth in (a) to (e) below. That is, (a) The vehicle lighting device has one or a plurality of light source units. (b) The light source unit comprises a plurality of light-emitting diodes which is soldered to one circuit board. (c) The light-emitting diode comprises a main body of a light emitting portion and two leads extending from a bottom surface of the main body. (d) The circuit board is provided with a plurality of pairs of through-holes, two in a pair. (e) After having undergone an automated LED fabrication process and an automated soldering process in a production line of the light source unit, the light-emitting diode has the two leads penetrating the two through-holes. Under this condition, the leads of the light-emitting diode and conductive traces (not shown) of the circuit board are connected to each other via the solder.

In the aforementioned vehicle lighting device, an object of the present invention is to provide a vehicle lighting device in which light-emitting diodes are arranged in place relative to the circuit board, and the leads of the light-emitting diodes and the conductive traces of the circuit board are reliably connected to each other via solder.

The present invention is characterized by the following (a) to (d) in order to achieve the aforementioned object. That is, (a) A light-emitting diode mount surface of the circuit board is provided with mount pads.
(b) On the circuit board, the mount pads are provided on both sides of a plurality of pairs of through-holes.
(c) When the two leads of LED are inserted into the two through-holes and the bottom surface of the main body is mounted to the mount pads on both sides, an air vent space is formed which is defined by the main body, the circuit board, and the mount pads on the both sides.
(d) The space is to allow air to come out smoothly of the through-holes when the solder has entered the through-holes.

The present invention is configured as described above, thereby allowing the following action and effects to be achieved.

That is, even when the main body of the light-emitting diode is mounted to the mount pads provided on the both sides of the circuit board, there is formed a space which is defined by the main body, the circuit board, and the mount pads on the both sides. This allows air in the through-holes to come out smoothly thereof via the space when solder has entered the through-holes in an automated soldering process. Accordingly, the present invention is free from the following problems.

Suppose the case where the main body of a light-emitting diode is mounted directly to the circuit board and solder has entered a through hole in an automated soldering process. In this case, the air trapped in the through hole is compressed to come out of the through hole while exerting force so as to detach the light-emitting diode from the circuit board and/or make holes in the soldered portion. Accordingly, such a case may occur where the light-emitting diode is disposed off the circuit board and/or holes are made in the solder between the lead of the light-emitting diode and the conductive trace of the circuit board.

The present invention is free from the aforementioned problems. Accordingly, the present invention can provide a vehicle lighting device in which the light-emitting diodes are arranged in place relative to the circuit board, and the leads of the light-emitting diodes and the conductive traces of the circuit board are reliably connected to each other via solder.

BRIEF DESCRIPTION OF THE DRAWINGS

These and other objects and advantages of the present invention will become clear from the following description with reference to the accompanying drawings, wherein.

DETAILED DESCRIPTION OF THE PREFERRED EMBODIMENTS

FIGS. 1 to 4 show a first embodiment of a vehicle lighting device according to the present invention. In this embodiment, a tail stop lamp of rear combination lamps is explained.

Figure 1:
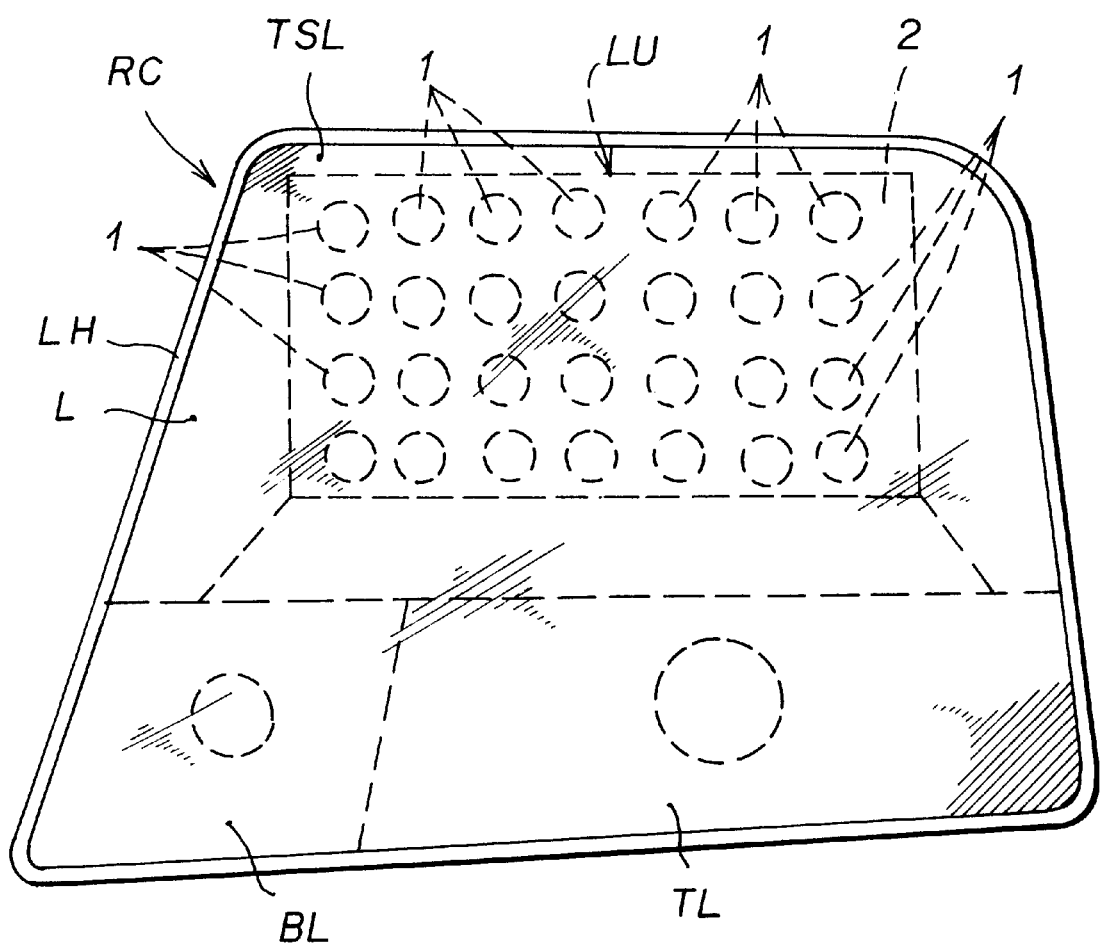
FIG. 1 is a front view showing a first embodiment of a vehicle lighting device of the present invention.
Figure 2:
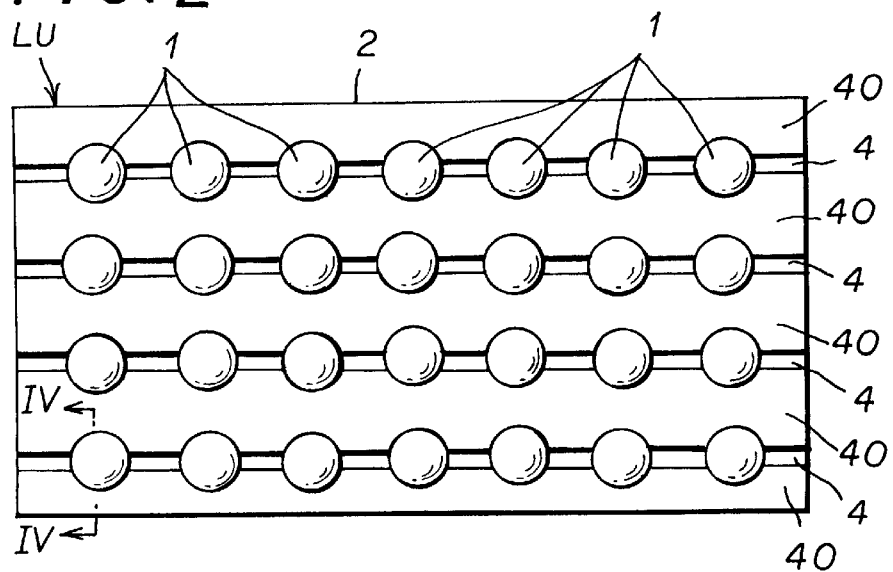
FIG. 2 is a front view showing a light source unit.
Figure 3:
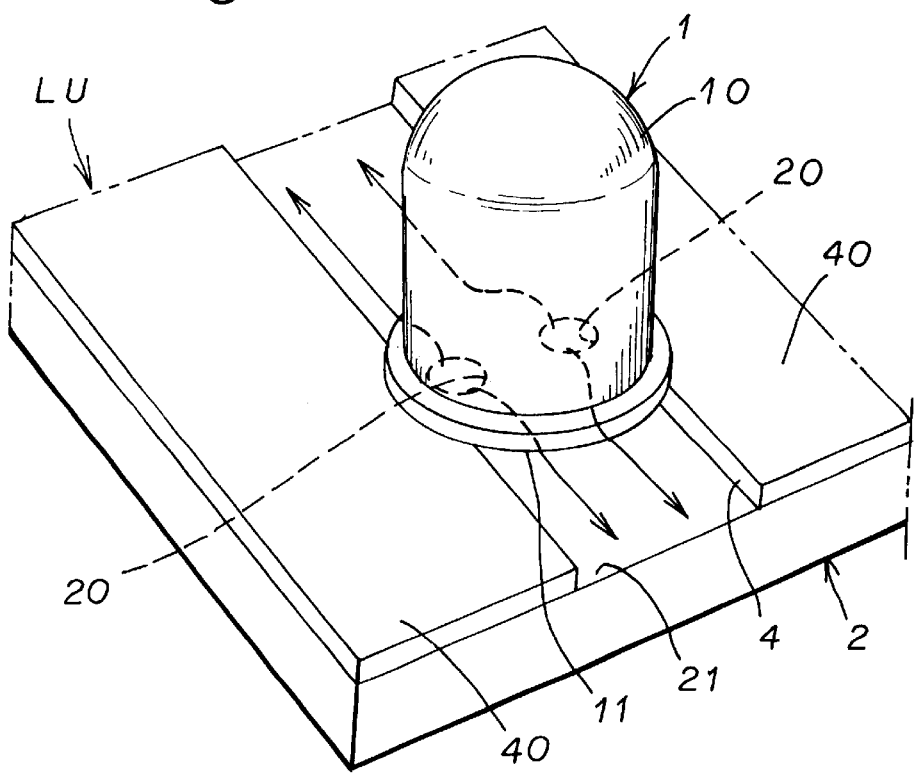
FIG. 3 is an explanatory, partially enlarged, perspective view showing the state in which air comes out of through-holes via a space and a groove.
Figure 4:
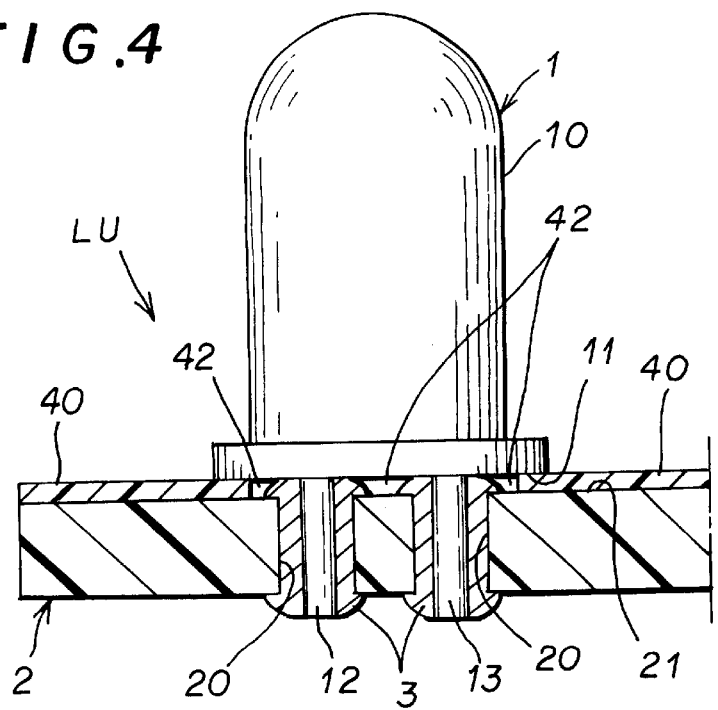
FIG. 4 is a cross-sectional view taken along line IV—IV of FIG. 1.

Referring to FIG. 1, RC designates a rear combination lamp that is mounted on the both sides, right and left, at the back of a car (illustrated in the figure is one mounted on the right). The rear combination lamp RC is made up of a tail stop lamp TSL or a vehicle lighting device according to the present invention, a turn signal lamp TL, and a back-up lamp BL.

The tail stop lamp TSL has a plurality of light-emitting diodes (LEDs) 1 as a light source. The tail stop lamp TSL includes a lamp housing LH, a lens L, and a light source unit LU disposed in a lighting chamber defined by the lamp housing LH and the lens L. Incidentally, the lens L is transparent. The lens L is provided, on at least one surface of either the inner or outer surface thereof, with a group of light scattering elements (not shown).

In the light source unit LU, a plurality of light-emitting diodes 1 is attached to a circuit board 2 with solder 3. In this example, a plurality of light-emitting diodes 1 is arranged in a matrix (in 4 rows and 7 columns) on the rectangular circuit board 2.

The light-emitting diode 1 includes a main body 10 of a light-emitting portion and two leads 12, 13 (a negative lead 12 and a positive lead 13), extending from the bottom 11 of the main body 10, generally perpendicular thereto and parallel to each other. The light-emitting diode 1 emits red light.

For example, the circuit board 2 is a printed circuit board, generally flexible, made of glass epoxy (FRP made of glass fiber and epoxy resin, that is, Fiberglass Reinforced Plastics). The circuit board 2 is provided with a plurality of pairs of through-holes 20, each pair having two through-holes, corresponding to the leads 12, 13 of the light-emitting diode 1. Incidentally, in the drawing figure, a pair of through-holes 20 is illustrated. Moreover, the through-holes 20 of this example have the shape of a small circle, however, the shape of the through-holes is not limited thereto in the present invention.

There are provided mount pads 40 on a light-emitting diode mount surface 21 of the circuit board 2. The mount pads 40 are provided on the both sides of the plurality of pairs of through-holes 20 of the circuit board 2. Five mount pads 40 are formed laterally in the shape of a stripe, parallel to each other, by screen-printing. The mount pads 40 are made of a material adherent to the circuit board 2, for example, epoxy resin. The mount pads 40 are white. The mount pads 40 have a height equal to the thickness of a film provided by the screen-printing.

In between the mount pads 40, four grooves 4 are formed in the shape of a stripe laterally, parallel to each other. Incidentally, in the present invention, it would present no problem to form the grooves 4 in a transverse direction, in a diagonal direction, or in a spiral fashion.

The bottom of the grooves 4 serves as the light-emitting diode mount surface 21 of the circuit board 2 and the through-holes 20 are disposed at the bottom of the grooves 4.The grooves 4 and the through-holes 20 are disposed in such a manner that a line connecting a pair of two through-holes 20 to each other is orthogonal to the direction of the stripe of the grooves 4. Incidentally, in the present invention, the grooves 4 and the through-holes 20 can be disposed otherwise.

After having undergone an automated LED fabrication process and an automated soldering process in a production line of the light source unit LU, the light-emitting diode 1 has the two leads 12, 13 penetrating the two through-holes 20. Under this condition, the leads 12, 13 of the light-emitting diode 1 and conductive traces (not shown) of the circuit board 2 are connected to each other via the solder 3. As such, a plurality of light-emitting diodes 1 is attached to a circuit board 2 with the solder 3 to produce a light source unit LU.

The vehicle lighting device according to the first embodiment of the present invention has the configuration described above and thus enables the following action and effect to be achieved.

That is, even when the main body 10 of the light-emitting diode 1 is mounted to the mount pads 40 on the sides of the circuit board 2, there is created a space 42 (refer to FIG. 4), a part of the groove 4, defined by the main body 10, the circuit board 2, and the mount pads 40 on the both sides. As shown by dashed and solid line arrows in FIG. 3, this allows the air in the through-holes 20 to come out smoothly thereof via the space 42 and the groove 4 when the solder 3 has entered the through-holes 20 in the automated soldering process. Therefore, the present invention has not such drawbacks as have been described in the summary of the invention.

Consequently, in the vehicle lighting device according to the first embodiment of the present invention, the light-emitting diodes 1 are disposed in place relative to the circuit board 2. It is also ensured that the leads 12, 13 of the light-emitting diodes 1 and the conductive traces of the circuit board 2 are connected to each other via the solder 3.

The vehicle lighting device according to the first embodiment of the present invention allows a plurality of light-emitting diodes 1 to be lit simultaneously, thereby radiating red light from the plurality of light-emitting diodes 1 outwardly via the lens L of the tail stop lamp TSL.

In particular, in this first embodiment, the mount pads 40 formed by screen-printing show white. For this reason, the vehicle lighting device of the present invention shows white, when the device is turned off and viewed from the front. At this time, since the lens L is provided with the group of light scattering elements, the plurality of light-emitting diodes 1 is camouflaged and thus cannot be seen.

Figure 5:
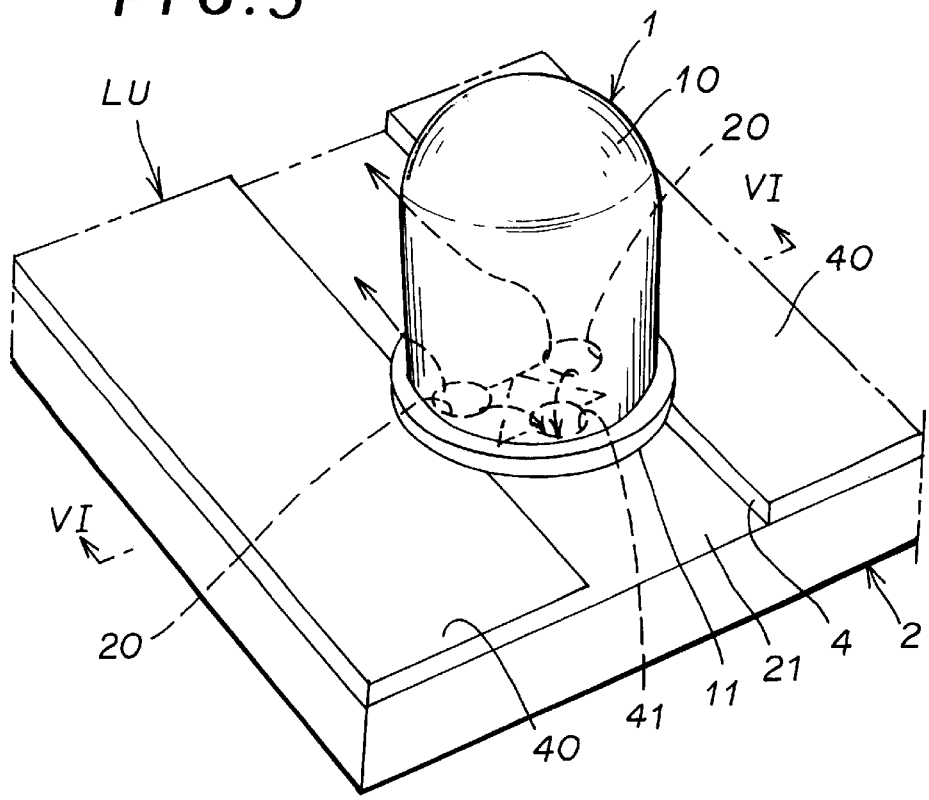
FIG. 5 is an explanatory, partially enlarged, perspective view of a second embodiment of a vehicle lighting device according to the present invention, showing the state in which air comes out of through-holes via air vent holes and a groove.
Figure 6:
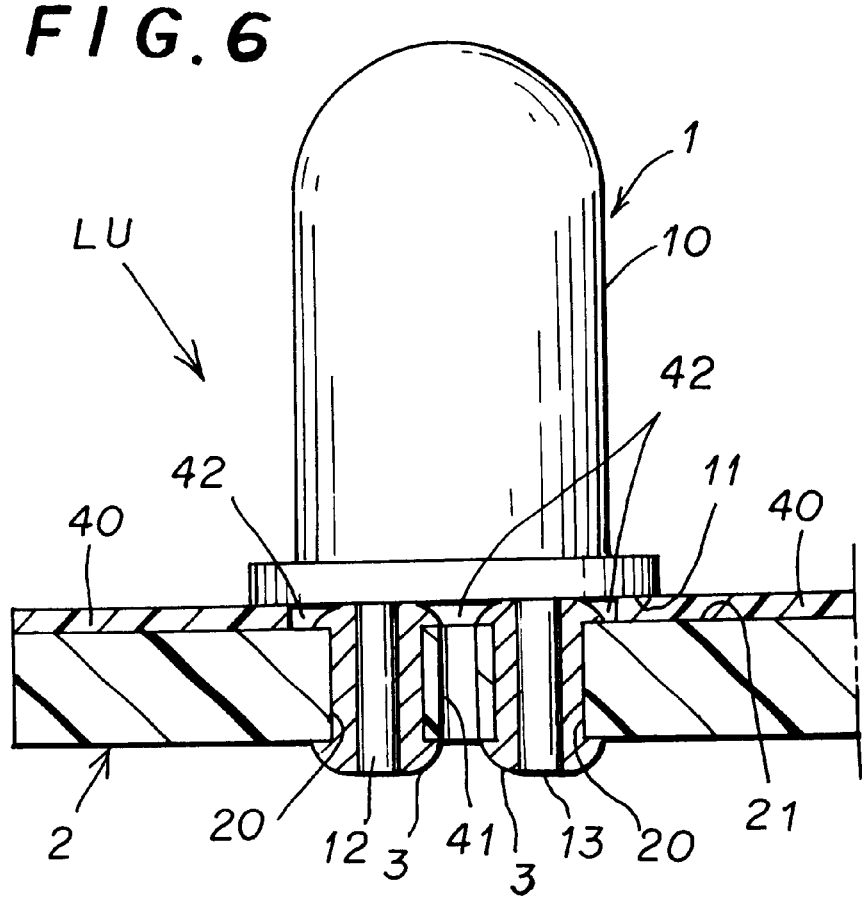
FIG. 6 is a cross-sectional view taken along line VI—VI of FIG. 5.

FIGS. 5 and 6 are views showing a second embodiment of the vehicle lighting device according to the present invention. In the figures, the same reference numerals as those in FIGS. 1 to 4 designate the same components.

This second embodiment has the following configuration. That is, the circuit board 2 is provided with an air vent through-hole 41 near the pair of through-holes 20. Incidentally, in the drawing figure, one air vent through-hole 41 is illustrated near the pair of the through-holes 20. However, in the present invention, it is no problem that a plurality of pairs of through-holes is provided with an air vent through-hole, respectively. In addition, in this example, a pair of through-holes 20 is provided with one air vent through-hole 41. However, in the present invention, it is no problem that a pair of through-holes is provided with a plurality of air vent through-holes. Moreover, the air vent through-hole 41 employed in this example has the shape of a small circle. However, the present invention imposes no limitation on the shape of the air vent through-hole.

The vehicle lighting device according to the second embodiment is configured as described above, thus achieving the identical action and effects as those of the first embodiment. That is, as shown by dashed and solid line arrows in FIG. 5, the air in the through-holes 20 smoothly comes out thereof via the space 42 through the air vent through-hole 41 and the groove 4 when the solder 3 has entered the through-holes 20 in the automated soldering process. In particular, according to the vehicle lighting device of the second embodiment, one air vent through-hole 41 provided near a pair of through-holes 20 facilitates venting air through the air vent through-hole 41 more effectively.

Figure 7:
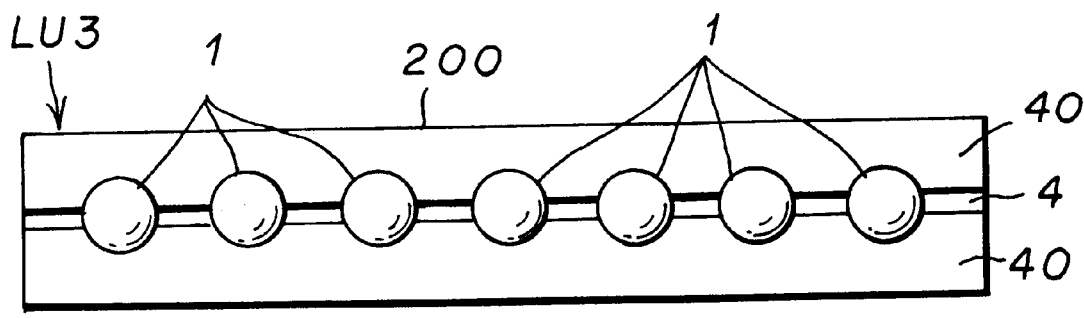
FIG. 7 is a front view of a light source unit showing a third embodiment of a vehicle lighting device according to the present invention.

FIG. 7 is a view showing a third embodiment of a vehicle lighting device according to the present invention. In the figure, the same reference numerals as those in FIGS. 1 to 6 designate the same components.

The vehicle lighting device according to the third embodiment includes a light source unit LU3 in which a plurality of light-emitting diodes 1 is arranged in an array on an elongated rectangular circuit board 200. The light source unit LU3 is most suitable for high mount stop lamps.

The vehicle lighting device according to the third embodiment can achieve the same action and effects as those provided by the first and second embodiments.

Incidentally, in the aforementioned embodiments, the tail stop lamp TSL for use in rear combination lamps RC has been explained. However, the present invention can also be applied to other vehicle lighting devices such as high mount stop lamps.

Furthermore, in the aforementioned embodiments, the screen printing method was employed to form the mount pads 40. However, in the present invention, any other means can be employed to form mount pads. For example, the portions to be provided with grooves on the upper surface of the circuit board can be masked and then coated, and the mask is removed, thereby forming mount pads having the thickness of the coating.

Incidentally, FIGS. 3 to 6 are diagrammatically illustrated.

While there has been described what are at present considered to be preferred embodiments of the present invention, it will be understood that various modifications may be made thereto, and it is intended that the appended claims cover all such modifications as fall within the true spirit and scope of the invention.

What is claimed is:

1. A vehicle lighting device employing a plurality of light emitting diodes as light sources, comprising one or a plurality of light source units, composed of a plurality of light emitting diodes soldered to a circuit board, said light emitting diode comprising a main body as a light emitting portion and two leads extending from a bottom surface of said main body, said circuit board being provided with a plurality of pairs of through-holes, two in a pair, a light emitting diode mount surface of said circuit board being provided with mount pads, said mount pads being provided on laterally opposite sides of said plurality of pairs of through-holes on the light emitting diode mount surface, wherein when said two leads are inserted into said two through-holes and the bottom surface of said main body is mounted to said mount pads on the laterally opposite sides, an air vent space is formed which is defined by said main body, said circuit board, and said mounted pads on the laterally opposite sides, and said space is to allow air to come out smoothly of said through-holes when said solder is entered said through-holes.

2. The vehicle lighting device according to claim 1, wherein said plurality of light emitting diodes is arranged in a matrix on said one circuit board.

3. The vehicle lighting device according to claim 1, wherein said mount pads are formed by screen-printing.

4. The vehicle lighting device according to claim 1, wherein said mount pads have the shape of a stripe, and said space has the shape of a groove defined by said stripe-shaped mount pads.

5. The vehicle lighting device according to claim 1, wherein said vehicle lighting device is a tail stop lamp for rear combination lamps or a high mount stop lamp, said light emitting diodes emit red light, and said mount pads formed by screen-printing show white.

6. The vehicle lighting device according to claim 1, wherein said circuit board is provided with one or a plurality of air vent through-holes near at least said pair of through-holes.

7. The vehicle lighting device according to claim 1, wherein said plurality of light emitting diodes is arranged in an array on said one circuit board.

\* \* \* \* \*